United States Patent [19]
Sato et al.

[11] Patent Number: 5,738,931
[45] Date of Patent: Apr. 14, 1998

[54] ELECTRONIC DEVICE AND MAGNETIC DEVICE

[75] Inventors: Toshiro Sato; Tetsuhiko Mizoguchi, both of Yokohama, Japan

[73] Assignee: Kabushiki Kaisha Toshiba, Kawasaki, Japan

[21] Appl. No.: 527,868

[22] Filed: Sep. 13, 1995

[30] Foreign Application Priority Data

Sep. 16, 1994 [JP] Japan .................................. 6-221444

[51] Int. Cl.⁶ .............................. B32B 3/00; B32B 15/00; H05K 1/00; H05K 1/03
[52] U.S. Cl. .......................... 428/209; 428/615; 428/901; 361/751; 174/256; 174/257; 156/625
[58] Field of Search ................................ 428/209, 270, 428/615, 901; 174/256, 257; 156/625; 361/751

[56] References Cited

U.S. PATENT DOCUMENTS

| | | | |
|---|---|---|---|
| 3,825,442 | 7/1974 | Moore | 428/210 |
| 3,862,017 | 1/1975 | Tsunemitsu et al. | 428/209 |
| 4,083,098 | 4/1978 | Nicholas | 428/209 |
| 4,581,279 | 4/1986 | Sugishita et al. | 428/209 |
| 4,760,481 | 7/1988 | Yuito et al. | 360/123 |
| 5,284,696 | 2/1994 | Satoh et al. | 428/210 |

FOREIGN PATENT DOCUMENTS 60-128641 7/1985 Japan.
1-277311 11/1989 Japan.

OTHER PUBLICATIONS

English Abstract of Japanese Publication No. JP1277311, dated Jan. 29, 1990.
English Abstract of Japanese Publication No. JP60128641, dated Nov. 15, 1985.

*Primary Examiner*—Cathy Lam
*Attorney, Agent, or Firm*—Finnegan, Henderson, Farabow, Garrett & Dunner, L.L.P.

[57] ABSTRACT

A electronic device is disclosed having an underlying conductor formed in a predetermined pattern on a surface of an underlying insulator and made of at least one member selected from the group consisting of Ti, Ta, Mo, Cr, Nb and W and their alloy, a main conductor made of Cu formed in a predetermined pattern on the underlying conductor, a first coating conductor made of at least one member selected from the group consisting of Ti, Ta, Mo, Nb and Ni and their alloy, and a second coating conductor made of at least one member selected from the group consisting of Au and Al and their alloy that are formed in this order so as to coat a surface of the main conductor made of Cu facing the surrounding insulator.

14 Claims, 7 Drawing Sheets

FIG. 10

ELECTRONIC DEVICE AND MAGNETIC DEVICE

BACKGROUND OF THE INVENTION

1. Field of the Invention

The present invention relates to an electronic device having a layered conductor wiring using Cu as a main conductor, and also relates to a magnetic device having a coil formed of a layered conductor wiring.

2. Description of the Related Art

Recently, there has been a rapid progress in light-weight miniaturization of various electronic apparatuses. There is a strong demand for electronic devices constituting the electronic apparatuses to be smaller, thinner, and lighter than ever before. To satisfy the demands, a surface mounting device (SMD) is now widely employed. Furthermore, to integrate SMDs at a high density, studies have been conducted on a multi-chip module (MCM) comprising a multi-layer wiring substrate and a plurality of bare chips mounted on the substrate.

In the multi-layer wiring substrate, it is required that the resistance of the wiring and the dielectric constant of the insulating material around the wiring should be low in order to reduce a signal transmission delay. To satisfy this requirement, Cu is used as a wiring conductor material and $SiO_2$, polyimide, or the like is used as a surrounding insulating material. If a structure is formed by contacting Cu directly with the insulating material, Cu will be diffused into $SiO_2$ or reacted with polyamic acid that is the precursor of the polyimide. Consequently, the dielectric constant of the insulating material decreases and further the wiring resistance increases, in some cases. Generally, in the prior art, a multi-layer wiring is formed so as not to contact Cu directly with the insulating material. For example, in the case where $SiO_2$ is used as the insulating material, Cu is coated with Ti or TiN to suppress Cu diffusion. On the other hand, when polyimide is used as the insulating material, Cu is coated with Ni or Ti to suppress the reaction between Cu and the precursor solution of the polyimide.

Now, we will explain an example of a manufacturing process of a conventional multi-layer wiring substrate using Cu as the main conductor and polyimide as an insulating material.

(a) First, on an insulating substrate made of, for example, alumina, a Ti film and a Cu film are sequentially formed by a vacuum deposition method or the like. The Ti film used herein is approximately 0.1 μm in thickness and is used as an underlying conductor exhibiting good adhesiveness to the substrate. The Cu film used herein is approximately 1 μm in thickness and is utilized as a conductor for a plating electrode which will be part of the main conductor. Thereafter, a thick resist film is coated over the entire surface of the above-obtained structure and is patterned by photolithography, thereby forming openings at a portion in which wiring is formed.

(b) After Cu as the main conductor is allowed to grow by electroplating in the opening portion of the resist to a predetermined thickness, the resist is peeled off. As a coating for suppressing the reaction between the Cu main conductor and a polyimide precursor, a Ti film is formed by the vacuum deposition method or the like so as to cover an exposed Cu face.

(c) A resist for removing a layered conductor (Ti/Cu/Ti) present in a space portion is patterned by photolithography. Thereafter, using the resist thus patterned as a mask, Ti and Cu are alternately etched by an enchant for removing Ti containing mainly of acetic acid, nitric acid and hydrofluoric acid, and by an etchant for removing Cu containing ferric chloride and water.

(d) A polyimide film serving as an insulator is formed over the entire surface and contact holes are made therein.

(e) The aforementioned steps (a) to (d) are repeated, thereby forming a multi-layer wiring. Finally, pad holes are made, and an Ni film having at least 1 μm in thickness and an Au film having at least 1 μm in thickness, both serving as a pad conductor, are sequentially formed by the vacuum deposition method or the like. After that, a resist (not shown) is patterned by photolithography. Using the resist pattern as a mask, Au and Ni present other than the pad portion are removed, thereby forming the pad conductor.

Figure 1:
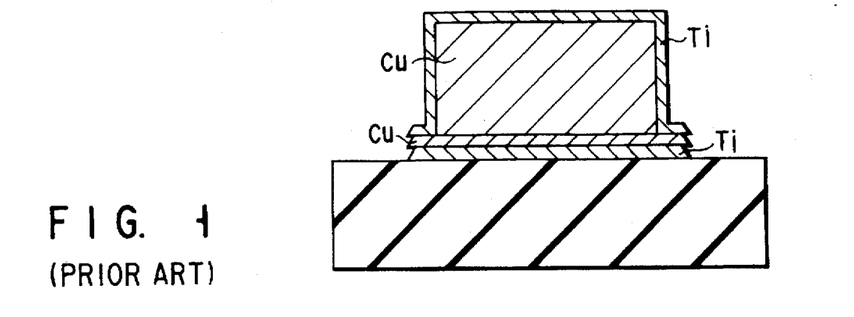
FIG. 1 is a cross-sectional view showing a conventional layered conductor wiring.

However, the aforementioned prior art has the following problems:

(1) It is difficult to control the alternate etching of Ti/Cu/Ti in Step (c) without failure. For example, when Cu is etched, a side etching of Cu is inevitable since Ti is scarcely etched. As a result, overhang of Ti occurs as shown in FIG. 1. If the overhang occurs in a lower portion of the conductor, air foams may be easily incorporated when a precursor of polyimide serving as an insulator is coated in a later step. Air foams, if incorporated in a multi-layer wiring substrate, cause various problems.

(2) Fabrication steps are complicated since patterning has to be performed after the pad portion is independently coated with a metal such as Ni or Au.

Of the aforementioned problems, it is considered that problem (2) can be overcome by coating the main conductor made of Cu with Al or an Al alloy as described in, for example, Jpn. Pat. Appln. KOKAI Publication No. 60-128641. However, the Al or Al alloy coating Cu induces stress-migration, thermal-migration, or electro-migration which may further cause hillocks. The generated hillocks are likely to develop into a number of voids which possibly facilitate reaction of an exposed Cu portion with an insulator.

Furthermore, the conductor material which is formed into a coil, is used in an planar inductor or transformer, and a thin-film magnetic head. In this case, also, Cu having a high conductivity is mostly used to reduce coil resistance. Hitherto, in such magnetic devices, a resist is widely used as an insulator between coil lines and of the upper portion of the coil lines (Amorphous Electron Device Research Institute, Research Report, April, 1994). This is because when polyimide or $SiO_2$ is used instead of a resist as an insulator, the same problems are caused as in the case of the multi-layer wiring substrate mentioned above, that is, difficulties associated with a process control and complexity of manufacturing steps. For example, in a thin-film magnetic head having a conductor consisting of Cu coated with Ni described in Jpn. Pat. Appln. KOKAI Publication No. 1-277311, the aforementioned problems are inevitably caused. When a resist is used as an insulator, due to poor thermal resistance of the resist, temperature of a process has to be reduced. In particular, when annealing is performed in the magnetic field to impart magnetic anisotropy to a magnetic substance, the uppermost temperature is restricted to a heat resistance temperature of the resist (approximately 200° C.). For this reason, it is impossible to sufficiently reduce magnetic anisotropic dispersion, causing problematic deterioration in frequency characteristic.

As described above, in electronic devices such as a multi-layer wiring substrate containing a layered conductor wiring using Cu as the main conductor, and in magnetic devices represented by an inductor, transformer and magnetic head, containing a planar coil formed of such layered conductor wiring, there are problems such as difficulties associated with a process control and complexity in manufacturing steps. Furthermore, since a process cost increases accompanying these problems, practical uses of the electronic devices and magnetic devices are delayed. Hence, they have not yet risen large-scale industrial demands.

SUMMARY OF THE INVENTION

An object of the present invention is to improve controlling of a process and is to simplify manufacturing steps of a layered conductor wiring using Cu as the main conductor, thereby attaining a reduction of cost and practical uses of the electronic devices such as a multi-layer wiring substrate and of the magnetic devices such as an inductor, transformer, and magnetic head, all using the layered conductor wiring.

The electronic device of the present invention comprises a conductor wiring enclosed with an underlying insulator and a surrounding insulator, the conductor wiring having an underlying conductor formed in a predetermined pattern on a surface of the underlying insulator and made of at least one selected from the group consisting of Ti, Ta, Mo, Cr, Nb, and W; a main conductor made of Cu formed on the underlying conductor in a predetermined pattern; a first coating conductor made of at least one selected from the group consisting of Ti, Ta, Mo, Nb, and Ni and a second coating conductor made of at least one selected from the group consisting of Au and Al that are formed in this order so as to coat the surface facing the surrounding insulator of the main conductor made of Cu.

The magnetic devices of the present invention are those which have a coil formed by using the layered conductor wiring having the aforementioned structure.

DETAILED DESCRIPTION OF THE PREFERRED EMBODIMENTS

Figure 2:
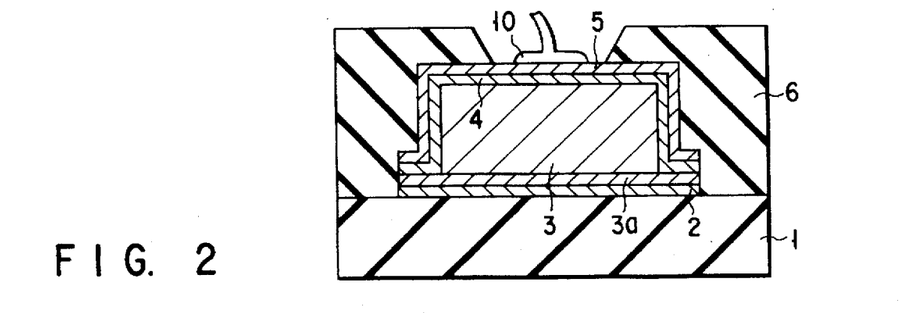
FIG. 2 is a cross-sectional view showing an example of the layered conductor wiring according to the present invention.

The layered conductor wiring according to the present invention is shown in FIG. 2. As shown in this figure, on an underlying insulator 1, an underlying insulator 2 processed in a predetermined pattern and the main conductor 3 made of Cu are formed. The surface facing a surrounding insulator of the main conductor 3 made of Cu is coated with a first coating conductor 4 and a second coating conductor 5. The surrounding insulator 6 made of polyimide or $SiO_2$ is provided on the layered conductor wiring having such a structure. Furthermore, contact holes are formed in the insulator 6, and a bonding wire 10 made of Au or Al is connected to the second coating conductor 5.

As described above, as the underlying conductor, use is made of at least one type of metal selected from the group consisting of Ti, Ta, Mo, Cr, Nb, and W and their alloy. As the first coating conductor, use is made of at least one type of metal selected from the group consisting of Ti, Ta, Mo, Nb, and Ni and their alloy. As the second coating conductor, use is made of at least one type of metal selected from the group consisting of Au and Al and their alloy.

The thickness of the underlying conductor 2 is preferably 0.05 µm or more, the thickness of the first and second coating conductors 4 and 5 is 0.5 µm or more, and preferably 1 µm or more. This is defined on the basis of the following. That is, if the thickness of the underlying conductor 2 is extremely thin, a failure in adhesion will occur due to diffusion of Cu. In contrast, if the thickness of the second coating conductors 4 and 5 is extremely thin, sufficient mechanical strength will not be obtained when bonding wires are connected to pad portions. The uppermost thickness of the underlying conductor 2, the first and second coating conductors 4 and 5 may be set to a value thinner than that of the main conductor 3 made of Cu. The uppermost thickness, although varies depending on usage, is generally 10 µm or less.

Figure 3A:
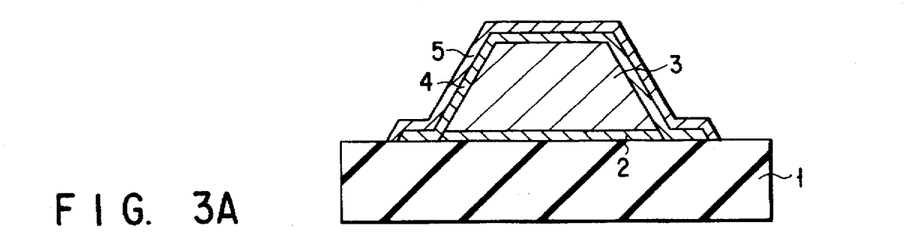
FIGS. 3A to 3C are cross-sectional views showing the layered conductor wiring according to the present invention.
Figure 3B:
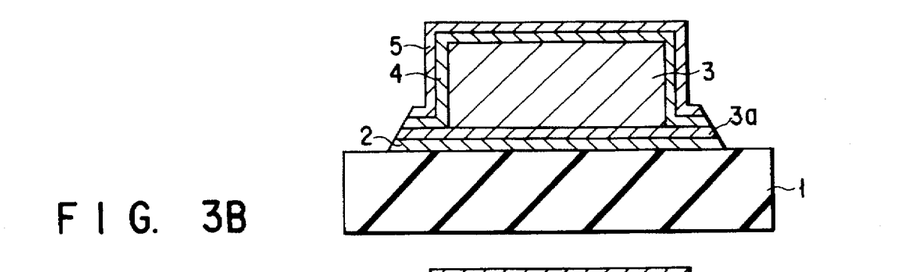
Figure 3C:
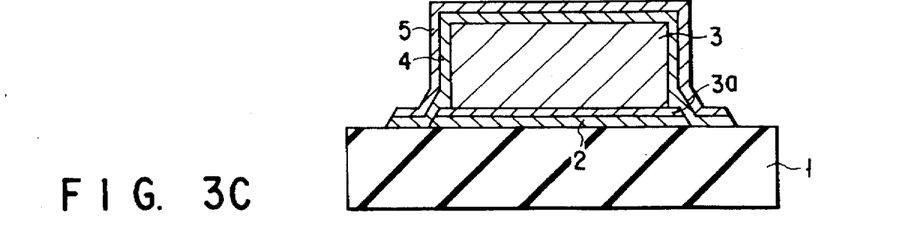

In the layered wiring according to the present invention, by selecting an appropriate metal species from the metal group mentioned above as the underlying conductor 2, the first and second coating conductors 4 and 5, no overhang are generated in the lower portion of a conductor wiring as shown in FIGS. 3A to 3C, although the conductor wiring is different in shape depending on a manufacturing process.

Cu as a main conductor is protected from $SiO_2$ or polyimide used as an insulator between adjacent conductors or an interlayer conductor applied in a multi-layer conductor, thereby suppressing Cu diffusion into $SiO_2$ and a reaction of Cu with polyimide.

Furthermore, since the first coating conductor interposed between the main conductor made of Cu and the second coating conductor made of Al, Au or an Al-Au alloy is a metal having a high melting point, the metal itself rarely causes migration, with the result that hillocks developing into voids are not generated. Owing to this, Cu will not be exposed and the conductor wiring using Cu as the main conductor will be improved in reliability.

Since the first coating conductor positioned in the lower portion of the second coating conductor (Al or/and Au) is a hard material, even if the second coating conductor, which is exposed by forming contact holes in the insulator 6 on the wiring, is used as a pad portion, and a bonding wire made of Al or Au is directly wedge-bonded or ball-bonded thereto, sufficient mechanical strength will be maintained. Accordingly, a step of depositing a metal onto a pad portion and patterning it, is no longer necessary, thereby shortening manufacturing steps.

In the layered conductor wiring according to the present invention, the main conductor made of Cu, the underlying conductor (hereinafter, referred to as "Metal A"), the first coating conductor (hereinafter, referred to as "Metal B") and the second coating conductor (hereinafter, referred to as "Metal C") may be formed by the vacuum deposition, sputtering method, or the like. Alternatively, thick Cu film may be formed as the main conductor by electroplating using a previously-formed Cu film as an electrode. The manufacturing process will be more specifically explained with reference to FIGS. 4A to 4E, FIGS. 5A to 5E, and FIGS. 6A to 6E.

Figure 4A:
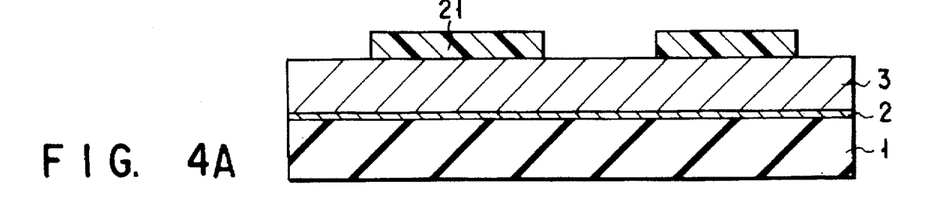
FIGS. 4A to 4E are cross-sectional views showing an example of the manufacturing process of the layered conductor wiring according to the present invention.
Figure 4B:
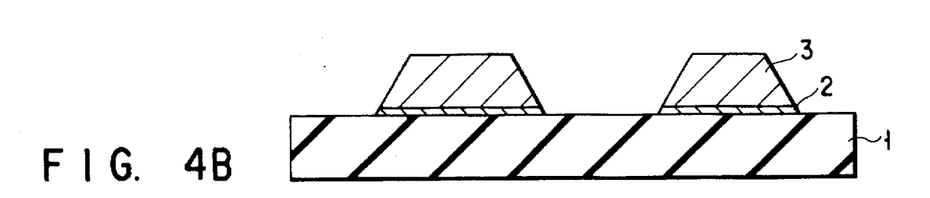
Figure 4C:
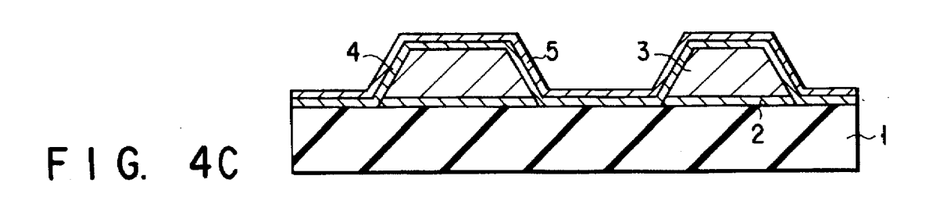
Figure 4D:
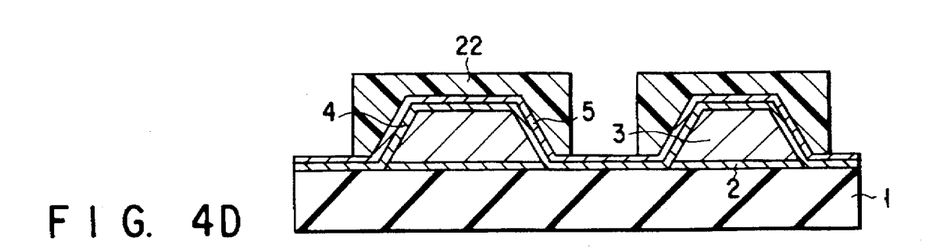
Figure 4E:
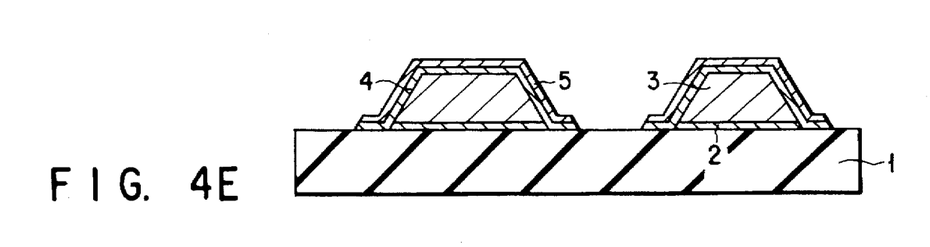

FIGS. 4A to 4E show an example of the manufacturing steps in the case where Cu as the main conductor is formed into a thin film of less than 10 μm in thickness by the vacuum deposition or the sputtering method. First, on an insulating substrate 1, an underlying conductor 2 made of Metal A, which strengthens the adhesiveness to the substrate, and a main conductor 3 made of Cu are formed. Upon the structure thus obtained, a photoresist 21 is formed in a predetermined pattern (FIG. 4A). Subsequently, using the photoresist 21 as a mask, Cu and Metal A are etched together with an etchant (FIG. 4B). Thereafter, over the entire surface of the above-obtained structure, a first coating conductor 4 made of Metal B and a second coating conductor 5 made of Metal C are sequentially formed (FIG. 4C). After that, a photoresist 22 is formed in a predetermined pattern so as to cover the main conductor line by photolithography (FIG. 4D). Then, using the photoresist 22 as a mask, Metals C and B present in the area other than the main conductor line are etched together (FIG. 4E).

In this method, Metal A and the etchant 1 used in the step of FIG. 4B should be chosen in such a way that the relationship of etching rates in the etchant 1 satisfy the following condition:

$$R_{1,Cu} \geq R_{1,A} \qquad (1)$$

Metals C, B and the etchant 2 used in the step of FIG. 4E should be chosen in such way that the relationship of etching rates in the etchant 2 satisfy the following condition:

$$R_{2,C} \geq R_{2,B} \qquad (2)$$

In this way, by choosing an appropriate metal species and an etchant, the lower portion of the wiring may be formed as shown in FIG. 3A and overhang will not be generated.

Figure 5A:
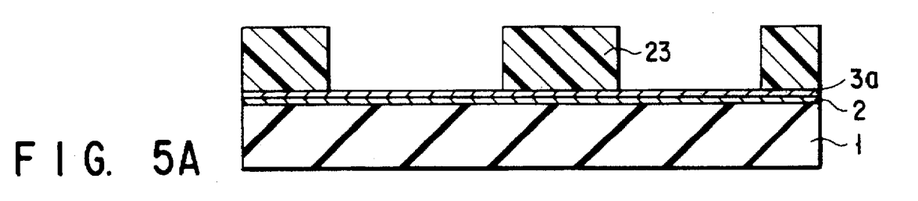
FIGS. 5A to 5E are cross-sectional views showing another example of the manufacturing process of the layered conductor wiring according to the present invention.
Figure 5B:
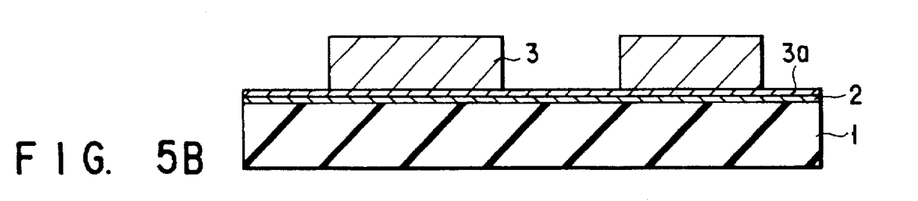
Figure 5C:
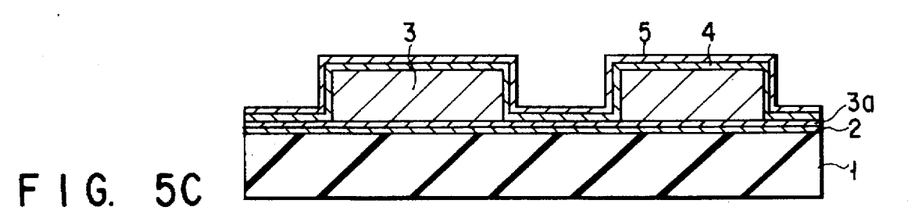
Figure 5D:
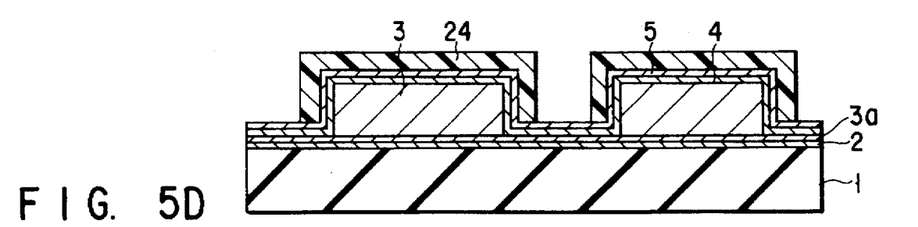
Figure 5E:
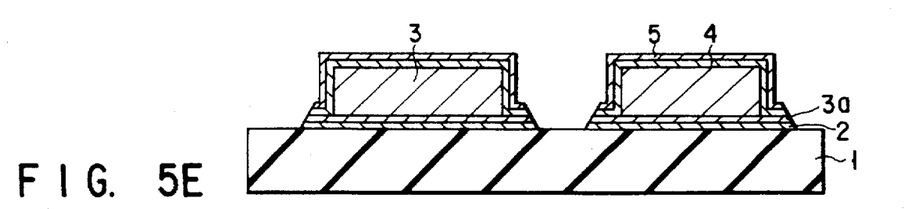

FIGS. 5A to 5E show an example of the manufacturing steps in the case where the main Conductor made of Cu is formed into a thick film of 10 μm or more in thickness by electroplating. First, on an insulating substrate 1, an underlying conductor 2 made of Metal A, which strengthens the adhesiveness to the substrate, and a conductor 3a for a plating electrode made of Cu which will be part of the main conductor, are formed. On the structure thus obtained, a photoresist 23 is formed in a predetermined pattern (FIG. 5A). Subsequently, using an appropriate plating solution, the main conductor made of Cu is allowed to grow on the conductor 3a for a plating electrode which exposed from a photoresist 23 and then the photoresist 23 is removed (FIG. 5B). Subsequently, over the entire surface of the above-obtained structure, a first coating conductor 4 made of Metal B and a second coating conductor 5 made of Metal C are sequentially formed (FIG. 5C). After that, a photoresist 24 is formed by photolithography in a predetermined pattern so as to cover the main conductor line (FIG. 5D). Further, using the photoresist 24 as a mask, Metals C and B, Cu and Metal A present in the area other than the main conductor line are etched together with an etchant (FIG. 5E).

In this method, Metals C, B, A and the etchant used in the step of FIG. 5E should be chosen in such a way that the relationship of etching rates in the etchant satisfy the following condition:

$$R_C \geq R_B \geq R_{Cu} \geq R_A \qquad (3)$$

In this way, by choosing an appropriate metal species and an etchant, the lower portion of the wiring may be formed as shown in FIG. 3B and overhang will not be generated.

FIGS. 6A to 6E show an example of the manufacturing steps using electroplating. First, on an insulating substrate 1, an underlying conductor 2 made of Metal A and a conductor 3a for a plating electrode made of Cu which will be part of the main conductor are formed in the same manners as in FIG. 5A. Further, on the above-obtained structure, a photoresist is formed in a predetermined pattern and the main conductor 3 made of Cu is allowed to grow by electroplating and then the photoresist is removed in the same manners as in FIG. 5B.

Figure 6A:
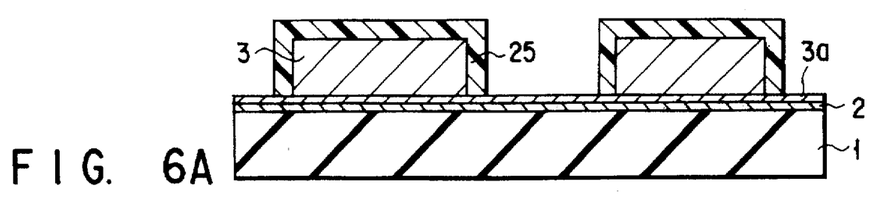
FIGS. 6A to 6E are cross-sectional views showing still another example of the manufacturing process of the layered conductor wiring according to the present invention.
Figure 6B:
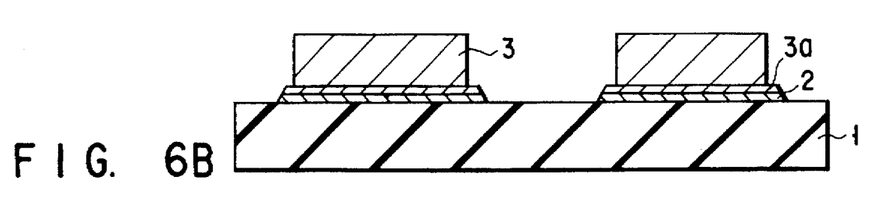
Figure 6C:
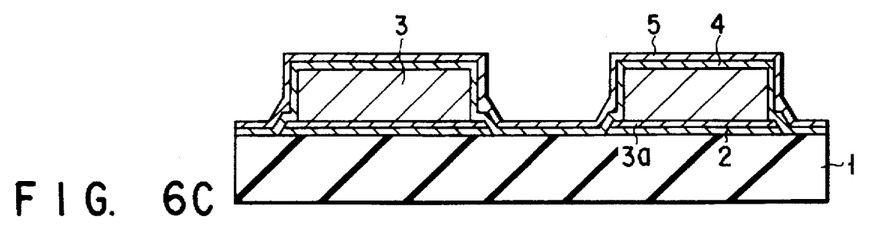
Figure 6D:
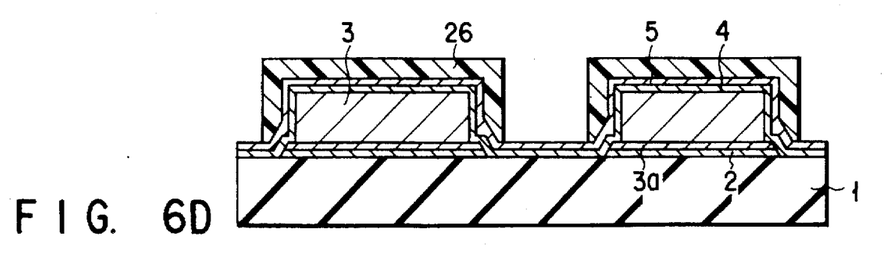
Figure 6E:
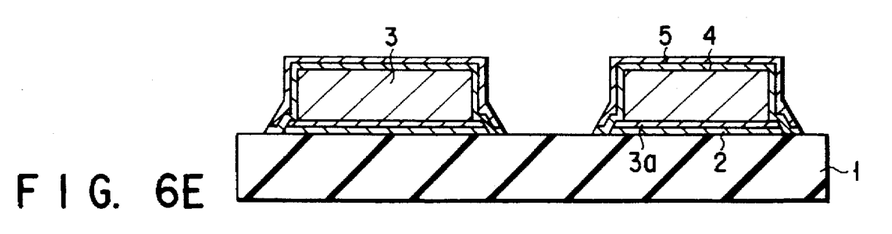

Subsequently, a photoresist 25 is formed in a predetermined pattern so as to cover the main conductor line (FIG. 6A). Thereafter, using the photoresist 25 as a mask, Cu and Metal A are etched together with an etchant (FIG. 6B). Then, over the entire surface, a first coating conductor 4 made of Metal B and a second coating conductor 5 made of Metal C are sequentially formed (FIG. 6C). After that, a photoresist 26 is formed by photolithography in a predetermined pattern so as to cover the main conductor line (FIG. 6D). Then, using the photoresist 26 as a mask, Metals C and B present in the area other than the main conductor line are etched together with an etchant (FIG. 6E).

Also in this method, Metal A and the etchant 1 used in the step of FIG. 6B should be chosen in such a way that the relationship of etching rates in the etchant 1 satisfy the condition given by aforementioned formula (1). Metals C, B and the etchant 2 used in the step of FIG. 6E should be chosen in such a way that the relationship of etching rates in the etchant 2 satisfy the condition given by the aforementioned formula (2).

In this way, by choosing an appropriate metal species and an etchant, the lower portion of the wiring may be formed as shown in FIG. 3C and overhang will not be generated.

A combination of a metal and an etchant satisfying the conditions given by formulas (1) to (3) may be uncountable. By way of reference of choosing a metal and an etchant satisfying predetermined conditions, the relative etching abilities of various types of metal elements to various etchants are listed in Table 1. With respect to a given etchant shown in Table 1, a metal susceptible to etching at room temperature is indicated as ⊚; a metal susceptible to etching at 100° C. is indicated as ○; and a metal insusceptible to etching is indicated as "x". Under predetermined etching conditions, the etching rate gets slower in sequential order of ⊚ to "x". Hence, with reference to this Table, the metal and etchant to be chosen can be determined.

TABLE 1

Main Metal elements and Etchants

| Etchant | Metal elements | | | | | | | | |
|---|---|---|---|---|---|---|---|---|---|
| | Al | Ti | Ta | Cr | Mo | W | Ni | Cu | Au |
| HF | ⊚ | ⊚ | ⊚ | x | x | x | x | x | x |
| HCl (dil.) | ⊚ | ○ | x | ⊚ | x | x | ○ | x | x |
| HCl (conc) | ⊚ | ⊚ | x | ⊚ | x | x | ⊚ | ○ | x |

TABLE 1-continued

Main Metal elements and Etchants

| Etchant | Al | Ti | Ta | Cr | Mo | W | Ni | Cu | Au |
|---|---|---|---|---|---|---|---|---|---|
| $HNO_3$ (dil.) | ○ | X | X | X | ⊚ | X | ⊚ | ⊚ | X |
| $HNO_3$ (conc) | ○ | X | X | X | ⊚ | X | X | ⊚ | X |
| $HClO_3$ (dil.) | ○ | X | X | X | ⊚ | X | ⊚ | ⊚ | X |
| $HClO_3$ (conc) | ○ | X | X | X | ○ | X | ⊚ | ⊚ | X |
| $H_2SO_4$ (dil.) | ⊚ | ○ | X | ⊚ | X | X | ⊚ | X | X |
| $H_2SO_4$ (conc) | ⊚ | ⊚ | — | ○ | ○ | — | ⊚ | ⊚ | X |
| $H_3PO_4$ (dil.) | ○ | ○ | X | X | X | X | ⊚ | X | X |
| $H_3PO_4$ (conc) | ⊚ | ⊚ | X | X | X | X | ⊚ | ○ | X |
| $H_2C_2O_4$ | ⊚ | ○ | X | X | X | X | ⊚ | X | X |
| $HNO_3$ (conc) + HCl (conc) | ⊚ | X | X | ○ | ⊚ | ○ | ⊚ | ⊚ | ⊚ |
| $NHO_3$ (conc) + HF | ⊚ | ⊚ | ⊚ | ⊚ | ⊚ | ⊚ | ⊚ | ⊚ | X |
| $CrO_3$ + $H_2SO_4$ | ⊚ | X | X | X | X | X | ⊚ | ⊚ | X |
| $FeCl_3$ | ⊚ | X | X | ⊚ | ⊚ | X | ⊚ | ⊚ | X |
| $SnCl_2$ | ⊚ | X | X | ⊚ | X | X | ⊚ | X | X |
| $HgCl_2$ | ⊚ | X | X | ⊚ | X | X | ⊚ | X | X |
| KOH(dil.) | ⊚ | X | X | X | X | X | X | X | X |
| KOH(conc) | ⊚ | X | ⊚ | X | X | X | X | ⊚ | X |
| $K_3Fe(CN)_6$ + KOH | ⊚ | X | ○ | ⊚ | ⊚ | ⊚ | — | ⊚ | X |
| $KI + I_2$ | ⊚ | X | X | — | X | X | ○ | ⊚ | ⊚ |

⊚; Susceptible to etching at room temperature
○; Susceptible to etching at 100° C.
X; non-susceptible to etching
—; no data

EXAMPLES

Hereinbelow, Examples of the present invention will be explained with reference to Figures.

Example 1

In accordance with manufacturing steps shown in FIGS. 4A to 4E, a layered conductor wiring is manufactured.

First, on the surface of an alumina substrate, a 0.1 μm-thick Mo film as an underlying conductor and a 5 μm-thick Cu film as the main conductor are sequentially formed by the vacuum deposition method. Thereafter, a photoresist pattern corresponding to a circuit pattern is formed by photolithography. Subsequently, using this photoresist pattern as a mask and a mixed solution consisting of phosphoric acid (77 vol %), nitric acid (3 vol %), acetic acid (15 vol %) and water (5 vol %) as an etchant, the 5 μm-thick Cu film and the 0.1 μm-thick Mo film are etched together. The etching rate of Cu herein is approximately 0.4 μm/min, and that of Mo is approximately 0.1 μm/min.

Second, over the entire surface, a 1 μm-thick Mo film as a first coating conductor and a 1 μm-thick Al film as a second coating conductor are sequentially formed by the vacuum deposition method. Subsequently, a photoresist pattern is formed so as to enclose the Cu/Mo wiring line. Using this photoresist pattern as a mask, and a mixed solution of phosphoric acid (95.4 vol %), nitric acid (0.6 vol %), acetic acid (3.0 vol %) and water (1.0 vol %) as an etchant, the 1 μm-thick Mo film and the 1 μm-thick Al film are etched together. The etching rate of Mo herein is approximately 0.05 μm/min, and that of Al is approximately 0.08 μm/min. Through these steps, a layered conductor wiring is successfully formed, with no overhang in the lower portion as shown in FIG. 3A.

Thereafter, polyamic acid as a polyimide precursor is spin-coated onto the entire surface so as not to incorporate air foams therein under reduced pressure, in an atmosphere of, its solvent, followed by curing at 350° C. for 120 minutes. On the polyimide insulator thus cured, a photoresist pattern for use in making contact holes is formed. Using this photoresist as a mask, chemical dry etching (CDE) using mixed gas of oxygen and carbon tetrafluoride is applied to the polyimide to form contact holes. Furthermore, on the thus obtained structure, layered conductor wirings constituting the second layers or above are sequentially formed, thereby preparing a multi-layer wiring substrate.

Example 2

In accordance with manufacturing steps shown in FIGS. 6A to 6E, a layered conductor wiring is manufactured as follows:

First, on a silicon substrate having a 0.2 μm-thick thermal oxide film on the surface thereof, a 0.1 μm-thick Mo film as an underlying conductor and a 1 μm-thick Cu film as a plating electrode conductor are subsequently formed by a DC magnetron sputtering method. After a photoresist pattern corresponding to a reversal pattern of a circuit pattern is formed by photolithography, Cu serving as the main conductor is electroplating onto the Cu film to 40 μm in thickness at a current density of 15 mA/cm$^2$, using a solution containing mainly sulfuric acid, copper sulfate, and hydrochloric acid. Thereafter, the resist is removed with acetone and the resultant structure is washed in pure water. Since the plated conductor has a reverse tapered form having an angle of 80°, if the resist pattern, whose width is slightly narrower than that of the plated conductor, is formed on the plated Cu conductor line as a mask and etching is performed with an etchant, i.e., a mixed solution of phosphoric acid (77 vol %), nitric acid (3 vol %), acetic acid (15 vol %) and water (5 vol %), excessive Cu can be removed. As a result, the width of the plated conductor line is slightly reduced but the reverse tapered portions almost disappear. At this time, simultaneously the Cu film is slightly etched away from the area (space portions) other than the lines. The Cu etching rate herein is 0.4 μm/min.

Thereafter, a photoresist pattern is formed so as to enclose the plated Cu conductor line. Using the photoresist pattern as a mask and a mixed solution of phosphoric acid (77 vol %), nitric acid (3 vol %), acetic acid (15 vol %) and water (5 vol %) as an etchant, the Cu film and Mo film of the space portions are etched away together. The Cu etching rate herein is 0.4 μm/min, and the Mo etching rate is 0.1 μm/min.

Subsequently, over the entire surface, 1 μm-thick Mo film as a first coating conductor and 1 μm-thick Al film as a second coating conductor are subsequently formed by the DC magnetron sputtering method. At this time, the Mo and Al films are formed under suitable conditions that a good step coverage is established, for example, under a raised Ar gas pressure, thereby coating a side wall of the 40 μm-thick Cu conductor with the Mo and Al films of 0.5 μm or more in thickness. After that, a photoresist pattern is formed so as to enclose the conductor line. Using the photoresist pattern as a mask, and a mixed solution of phosphoric acid (95.4 vol %), nitric acid (0.6 vol %), acetic acid (3.0 vol %) and water (1.0 vol %) as an etchant, the 1 μm-thick Mo film and 1 μm-thick Al film are etched away together. The Mo etching rate herein is approximately 0.05 μm/min and the Al etching rate is approximately 0.08 μm/min.

Through these steps, a thick-film layered conductor wiring can be formed with no overhang in the lower portion as shown in FIG. 3C.

Subsequently, polyimide is formed in the same manner as in Example 1 and contact holes are made by chemical dry etching. Furthermore, on the above-obtained structure, layered conductor wirings constituting circuit patterns of the second layer or above are sequentially formed, thereby forming a multi-layer thick-film wiring substrate.

Example 3

Figure 7A:
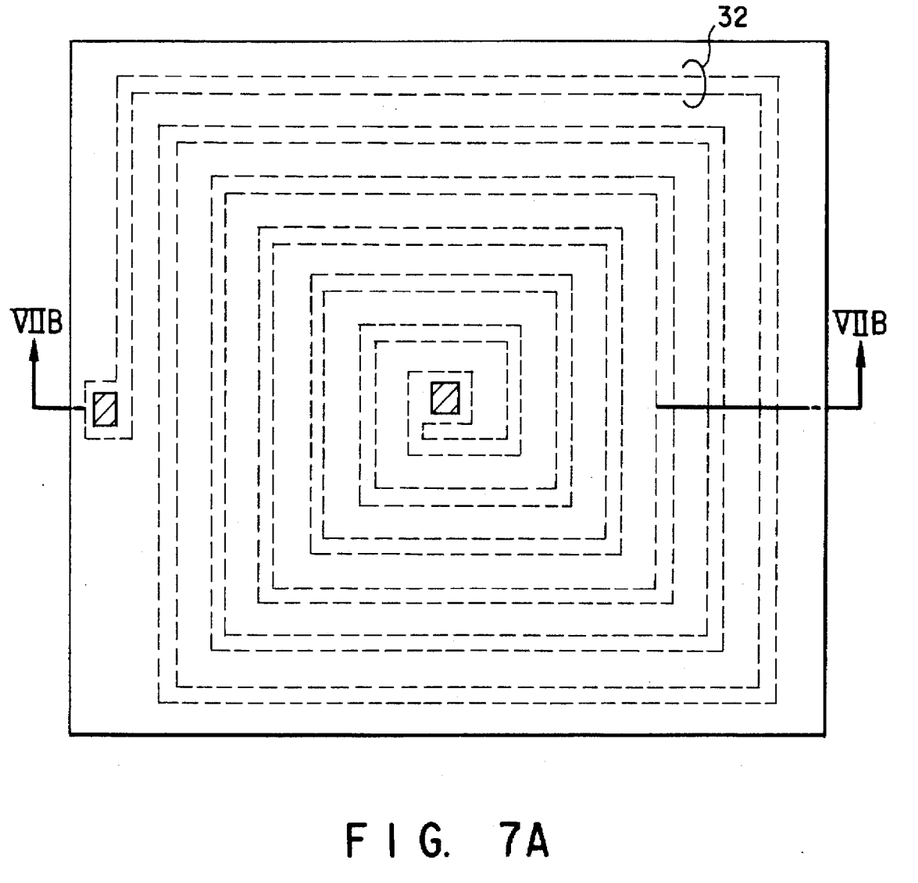
FIGS. 7A and 7B are a plan and cross-sectional views of the thin-film coil fabricated in Example 3 of the present invention.
Figure 7B:
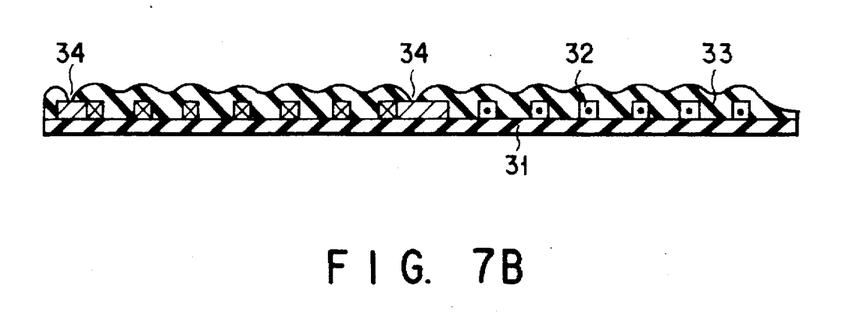

A planar thin-film coil shown in FIGS. 7A and 7B is manufactured in accordance with the steps of the Example 1. FIG. 7A is a plan view and FIG. 7B is a cross-sectional view. In FIGS. 7A and 7B, on an alumina substrate 31, a planar coil 32 consisting of a mono-layered conductor wiring having a structure shown in FIG. 3A. The planar thin-film coil has a square spiral pattern with a number of turns of 5. The line and space of the layered conductor are 20 μm in width, an outer size of the square spiral coil is 500 μm. Subsequently, an $SiO_2$ film 33 serving as an insulating film between conductor lines and a protection film is coated over the entire surface by the plasma CVD method. Thereafter, using a resist as a mask, pad portions 34 are made by the RIE method using carbon tetrafluoride as reaction gas. Thereby an Al surface is exposed.

The coil functions normally as a direct current choke for a power amplifier used in an 800 MHz analog mobile phone.

Example 4

Figure 8A:
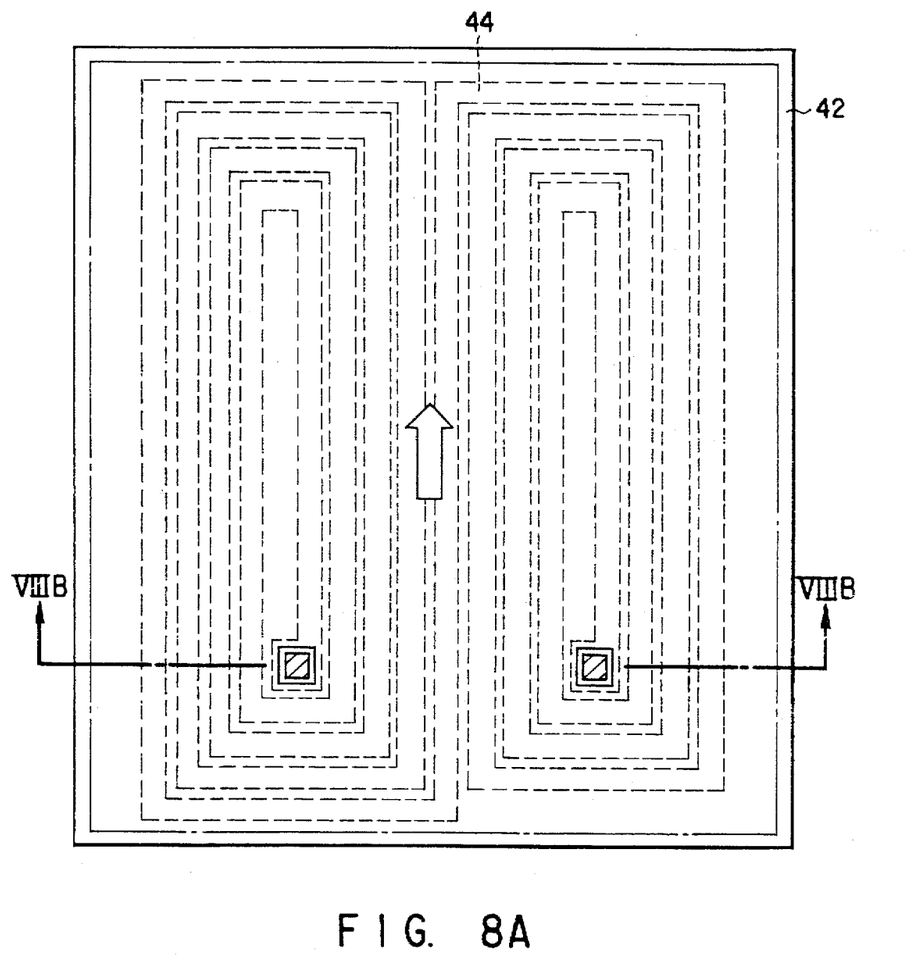
FIGS. 8A and 8B are a plan and cross-sectional views of a planar choke coil fabricated in Example 4 of the present invention.
Figure 8B:
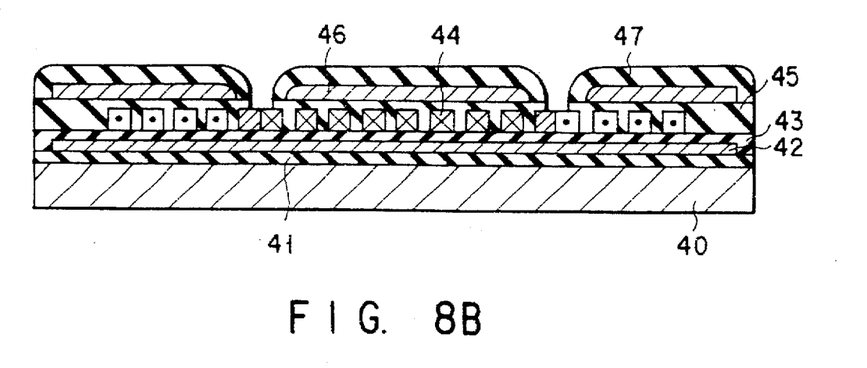

A planar choke coil for an MHz switching power source, shown in FIGS. 8A and 8B, is manufactured in accordance with the steps of Example 2. FIG. 8A is a plan view and FIG. 8B is a cross-sectional view. In FIGS. 8A and 8B, on a silicon substrate 40 having a thermal oxide film 41 on the surface thereof, a lower magnetic thin film 42, an $SiO_2$ film 43, a coil 44, a polyimide film 45, an upper magnetic thin film 46, and a polyimide film 47 are subsequently formed. The coil 44 is sandwiched between the upper magnetic thin film 46 and the lower magnetic thin film 42. In this choke coil, uniaxial magnetic anisotropy is imparted to the magnetic thin films, of which easy axis of magnetization is indicated by an arrow in FIG. 8A, so that the magnetic thin films are excited in the direction of the hard axis of magnetization in almost all area of the device.

Hereinafter, a manufacturing process of the choke coil will be explained in detail. On a silicon substrate 40 having a thermal oxide film 41 formed thereon, 0.1 μm-thick Al, $AlN_x$ (x=0–0.5) and $AlN_x$ (x=0.5–1) films (not shown) are sequentially formed to improve adhesiveness of the lower magnetic thin film. On the $AlN_x$ (x=0.5–1) film, a 6.0 μm-thick lower magnetic thin film 42 is formed. The magnetic thin film 42 is of FeCoBC-based and hetero amorphous magnetic film in which an amorphous magnetic phase rich in FeCo and an amorphous insulating phase rich in boron and carbon are homogeneously dispersed. The saturation magnetic flux density of the film 42 is 1.6 T, the relative magnetic permeability in the direction of the hard axis of magnetization is 1100, and resistivity is 300 μΩ·cm. Using a resist pattern as a mask and a mixed solution of phosphoric acid (77 vol %), nitric acid (3 vol. %), acetic acid (15 vol %) and water (5 vol %) as an etchant, the magnetic thin film is etched. On this structure, 5.0 μm-thick $SiO_2$ film 43 is formed by sputtering. On the film 43, a coil 44 consisting of a layered conductor having a cross-sectional structure shown in FIG. 3C is formed in the same manner as in Example 2. The coil 44 has a pattern in which two rectangular spiral coils, one is a right handed spiral, the other is a left handed spiral, are juxtaposed to each other. The number of turns of the coil is 6. The thickness of the Cu conductor is 50 μm.

Subsequently, a polyimide film 45 is formed between lines of the coil 44 and on the lines in the same manner as in Example 1. After the surface of the polyimide film 45 is sufficiently made flat, a 6 μm-thick upper magnetic thin film 46 is formed of the same material as that employed in the lower magnetic thin film 42 and etched in the same manner as in the case of the lower magnetic thin film 42. Further, over the film 46, a polyimide film 47 is formed as a protecting film. Subsequently, a resist pattern is formed in order to make holes in pad portions. Using the resist pattern as a mask, the polyimide film 47 is etched by chemical dry etching using mixture gas of oxygen and carbon tetrafluoride and thereby the Al surface of the pad portion is exposed. Finally, a direct current magnetic field of 4 kA/m is applied to the magnetic thin films in the direction of an arrow shown in FIG. 8A in vacuum and then the films are subjected to heat treatment at 320° C. to impart uniaxial magnetic anisotropy. Alternatively, the uniaxial magnetic anisotropy can be imparted by forming a soft magnetic thin film in a direct current magnetic field.

The planar choke coil thus obtained has an inductance of 0.5 μH and a direct current coil resistance of 0.2 Ω. Further, a direct current at which the inductance reduces by 50% is 1.5 A.

A control IC, MOSFET for switching, and a Schottoky diode for rectification, all are bear chips, and the choke coil are bonded to each other with an Au wire of 50 μm in diameter, thereby forming a boost chopper type DC to DC converter functioning at 5 MHz. This converter is capable of raising a 3.6 V input voltage to 5.0 V and its power conversion efficiency is 82% at the time when 3.0 W of power is output.

Figure 9:
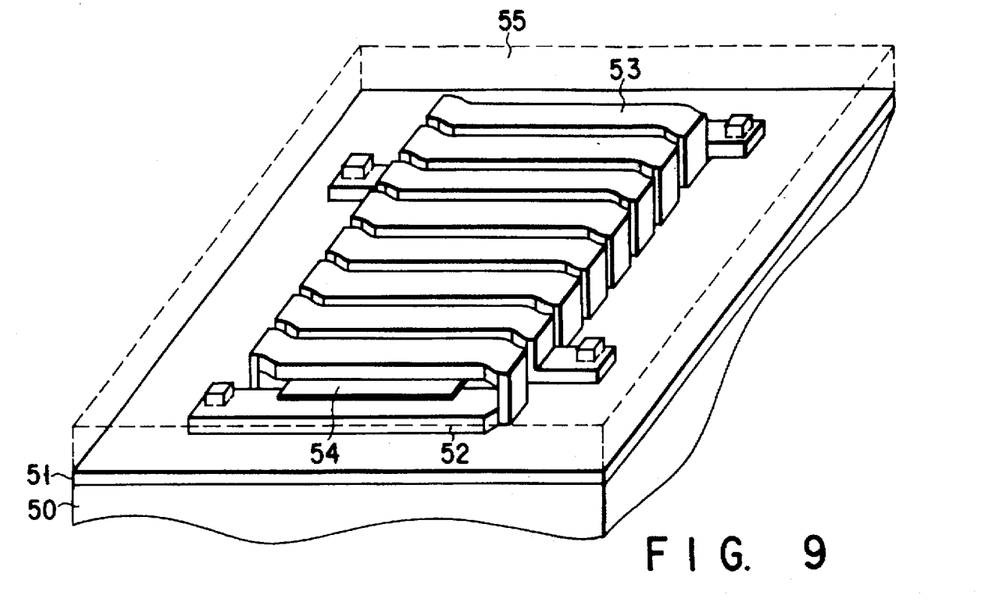
FIG. 9 is a perspective view of the planar transformer fabricated in another Example of the present invention.

Other than the aforementioned Examples, various electronic devices and magnetic devices can be manufactured by applying the present invention as described follows:

For example, in accordance with the same manufacturing process of the layered conductor wiring as in Example 2, a planar transformer can be formed, which has a primary and secondary layered conductor coils wound around a magnetic thin film as shown in FIG. 9. In FIG. 9, on a silicon substrate 50 having a thermal oxide film 51 formed thereon, the lower conductor of a primary coil 52, the lower conductor of a secondary coil 53, a magnetic substance 54, the upper conductor of the primary coil 52 and the upper conductor of the secondary coil 53, each independently insulated, are layered. The lower conductor and upper conductor constituting each coil are formed in a predetermined pattern in the same manner as in Example 2 and connected to each other. The entire surface of the transformer is coated with a polyimide film 55. Pad holes are made at portions of the surface corresponding to both ends of the primary coil 52 and secondary coil 53.

Figure 10:
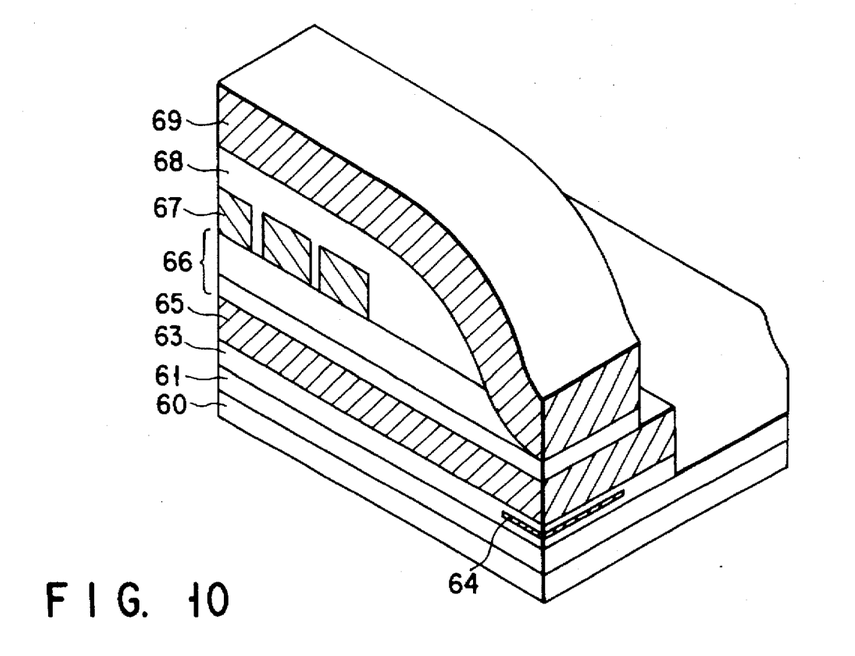
FIG. 10 is a perspective view of the thin-film magnetic head fabricated in still another Example of the present invention.

Furthermore, a thin-film magnetic head for a hard disk drive as shown in FIG. 10 can be manufactured. In FIG. 10, on a silicon substrate 60 having a thermal oxide film 61 formed thereon, $SiO_2$ film 63 having an MR sensor 64 embedded therein, the lower core 65 made of CoZrNb amorphous soft magnetic thin film, $SiO_2$ film 66 which forms a 0.1 μm recording gap at the end of the head, a layered conductor coil 67 formed in the same manner as in Example 2, a polyimide film 68 coated on the layered conductor coil 67, and an upper core 69 made of 2.0

μm-thick CoZrNb amorphous soft magnetic thin film are subsequently formed.

Furthermore, other than Examples mentioned above, the layered conductor wiring of the present invention can be used in a wiring of a semiconductor device.

What is claimed is:

1. An electronic device having a conductor wiring enclosed with an underlying insulator and a surrounding insulator, wherein said conductor wiring comprises an underlying conductor formed in a pattern on a surface of the underlying insulator, the underlying conductor made of at least one material selected from the group consisting of Ti, Ta, Mo, Cr, Nb, and W and their alloy;

a main conductor made of Cu formed in a pattern on said underlying conductor;

a first coating conductor made of at least one material selected from the group consisting of Ti, Ta, Mo, Nb, and Ni and their alloy, and a second coating conductor made of at least one material selected from the group consisting of Au and Al and their alloy that are formed in this order so as to coat a surface of said main conductor made of Cu facing the surrounding insulator.

2. The electronic device according to claim 1, wherein said underlying conductor has a thickness of 0.05 to 10 μm.

3. The electronic device according to claim 1, wherein said first and second coating conductors have a thickness of 0.5 to 10 μm.

4. The electronic device according to claim 3, wherein said first and second coating conductors have a thickness of 1 to 10 μm.

5. The electronic device according to claim 1, wherein when said main conductor made of Cu and underlying conductor are simultaneously etched with a first etchant, if etching rates of said main conductor and underlying conductor are defined as $R_{1,Cu}$ and $R_{1,A}$, respectively, said etching rates should satisfy the following relationship:

$$R_{1,Cu} \geq R_{1,A},$$

and when said first and second coating conductors are simultaneously etched with a second etchant, if etching rates of said first and second coating conductors are defined as $R_{2,B}$ and $R_{2,C}$, respectively, said etching rates should satisfy the following relationship:

$$R_{2,C} \geq R_{2,B}.$$

6. The electric device according to claim 1, wherein when said main conductor made of Cu, said underlying conductor, and said first and second coating conductors are simultaneously etched with an etchant, if etching rates of said main conductor, underlying conductor and first and second coating conductors are defined as $R_{Cu}$, $R_A$, $R_B$ and $R_C$, respectively, said etchings rates should satisfy the following relationship:

$$R_C \geq R_B \geq R_{Cu} \geq R_A.$$

7. The electronic device according to claim 1, further comprising:

a second conductor wiring formed on the surface of the surrounding insulator, wherein the second conductor wiring comprises:

a second underlying conductor formed in a pattern on a surface of the surrounding insulator, the second underlying conductor made of at least one material selected from the group consisting of Ti, Ta, Mo, Cr, Nb, and W and their alloy;

a second main conductor made of Cu formed in a pattern on said second underlying conductor;

a third coating conductor made of at least one material selected from the group consisting of Ti, Ta, Mo, Nb, and Ni and their alloy, and a fourth coating conductor made of at least one material selected from the group consisting of Au and Al and their alloy that are formed in this order so as to coat a surface of said second main conductor; and a second surrounding insulator disposed about the second conductor wiring.

8. A magnetic device having a coil made of a conductor enclosed with an underlying insulator and a surrounding insulator, wherein said coil comprises an underlying conductor formed in a pattern on a surface of the underlying insulator, the underlying conductor made of at least one material selected from the group consisting of Ti, Ta, Mo, Cr, Nb, and W and their alloy;

a main conductor made of Cu formed in a pattern on said underlying conductor;

a first coating conductor made of at least one material selected from the group consisting of Ti, Ta, Mo, Nb, and Ni and their alloy, and a second coating conductor made of at least one material selected from the group consisting of Au and Al and their alloy that are formed in this order so as to coat a surface of said main conductor made of Cu facing the surrounding insulator.

9. The magnetic device according to claim 8, wherein said underlying conductor has a thickness of 0.05 to 10 μm.

10. The magnetic device according to claim 8, wherein said first and second coating conductors have a thickness of 0.5 to 10 μm.

11. The magnetic device according to claim 10, wherein said first and second coating conductors have thickness of 1 to 10 μm.

12. The magnetic device according to claim 8, wherein when said main conductor made of Cu and said underlying conductor are simultaneously etched with a first etchant, if etching rates of said main conductor and underlying conductor are defined as $R_{1,Cu}$ and $R_{1,A}$, respectively, said etching rates should satisfy the following relationship:

$$R_{1,Cu} \geq R_{1,A},$$

and when said first and second coating conductors are simultaneously etched with a second etchant, if etching rates of said first and second coating conductors are defined as $R_{2,B}$ and $R_{2,C}$, respectively, said etching rates should satisfy the following relationship:

$$R_{2,C} \geq R_{2,B}.$$

13. The magnetic device according to claim 8, wherein when said main conductor made of Cu, said underlying conductor, and said first and second conductors are simultaneously etched with an etchant, if etching rates of said main conductor, said underlying conductor and said first and second conductors are defined as $R_{Cu}$, $R_A$, $R_B$ and $R_C$, respectively, said etching rates should satisfy the following relationship:

$$R_C \geq R_B \geq R_{Cu} \geq R_A.$$

14. The magnetic device according to claim 8, wherein said coil has a planar form.

* * * * *

UNITED STATES PATENT AND TRADEMARK OFFICE
CERTIFICATE OF CORRECTION

PATENT NO.   : 5,738,931                    Page 1 of 2
DATED        : April 14, 1998
INVENTOR(S)  : Toshiro SATO et al.

It is certified that error appears in the above-indentified patent and that said Letters Patent is hereby corrected as shown below:

Title Page, Item [57], in the Abstract, line 1, "A electronic" should read --An electronic--.

In Claim 5, col. 11, line 36, "$R_{1.Cu}$ and $R_{1.A}$" should read --$R_{1\cdot Cu}$ and $R_{1\cdot A}$--.

In Claim 5, col. 11, line 38, "$R_{1.Cu} \geq R_{1.A}$" should read --$R_{1\cdot Cu} \geq R_{1\cdot A}$--.

In Claim 5, col. 11, line 44, "$R_{2.B}$ and $R_{2.C}$" should read --$R_{2\cdot B}$ and $R_{2\cdot C}$--.

In Claim 5, col. 11, line 47, "$R_{2.C} \geq R_{2.B}$" should read --$R_{2\cdot C} \geq R_{2\cdot B}$--.

In Claim 11, col. 12, line 35, before "thickness", insert --a--.

In Claim 12, col. 12, line 40, "$R_{1.Cu}$ and $R_{1.A}$" should read --$R_{1\cdot Cu}$ and $R_{1\cdot A}$--.

In Claim 12, col. 12, line 43, "$R_{1.Cu} \geq R_{1.A}$" should read --$R_{1\cdot Cu} \geq R_{1\cdot A}$--.

In Claim 12, col. 12, line 49, "$R_{2.B}$ and $R_{2.C}$" should read --$R_{2\cdot B}$ and $R_{2\cdot C}$--.

In Claim 12, col. 12, line 52, "$R_{2.C} \geq R_{2.B}$" should read --$R_{2\cdot C} \geq R_{2\cdot B}$--.

UNITED STATES PATENT AND TRADEMARK OFFICE
CERTIFICATE OF CORRECTION

PATENT NO. : 5,738,931
DATED : April 14, 1998
INVENTOR(S) : Toshiro Sato, et. al.

It is certified that error appears in the above-identified patent and that said Letters Patent is hereby corrected as shown below:

In Claim 12, col. 12, line 52, "$R_{2\cdot C} \geqq R_{2\cdot B}$" should read --$R_{2\cdot C} \geq R_{2\cdot B}$--.

Signed and Sealed this

Twenty-fourth Day of August, 1999

Attest:

Q. TODD DICKINSON

*Attesting Officer*   *Acting Commissioner of Patents and Trademarks*